United States Patent
Takeda et al.

(10) Patent No.: US 10,251,267 B2
(45) Date of Patent: Apr. 2, 2019

(54) TRANSPARENT ELECTRODE, ORGANIC ELECTRONIC ELEMENT, AND METHOD FOR PRODUCING TRANSPARENT ELECTRODE

(71) Applicant: Konica Minolta, Inc., Tokyo (JP)

(72) Inventors: Akihiko Takeda, Sagamihara (JP); Takatoshi Suematsu, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 1133 days.

(21) Appl. No.: 14/347,471

(22) PCT Filed: Sep. 27, 2012

(86) PCT No.: PCT/JP2012/074887
§ 371 (c)(1),
(2) Date: Mar. 26, 2014

(87) PCT Pub. No.: WO2013/047660
PCT Pub. Date: Apr. 4, 2013

(65) Prior Publication Data
US 2014/0224322 A1    Aug. 14, 2014

(30) Foreign Application Priority Data

Sep. 28, 2011    (JP) .................. 2011-211918

(51) Int. Cl.
*H05K 1/09*   (2006.01)
*H01L 51/44*   (2006.01)
(Continued)

(52) U.S. Cl.
CPC ............. *H05K 1/09* (2013.01); *H01L 51/442* (2013.01); *H01L 51/445* (2013.01);
(Continued)

(58) Field of Classification Search
CPC . H01L 51/445; H01L 51/5212; H01L 51/442; H01L 51/0037; H01L 51/5215;
(Continued)

(56) References Cited

U.S. PATENT DOCUMENTS

2008/0129193 A1*  6/2008  Asabe .................. H01L 51/5206
                                                                     313/504
2010/0308281 A1* 12/2010  Zheng ................. C08L 101/005
                                                                     252/519.33
2012/0298971 A1* 11/2012  Lee ..................... H01L 51/0045
                                                                     257/40

FOREIGN PATENT DOCUMENTS

JP    2003-297582 A    10/2003
JP    2006-500463 A     1/2006
(Continued)

OTHER PUBLICATIONS

Office Action dated Aug. 23, 2016 from the corresponding Japanese Application; Patent Application No. 2013-536381; Applicant: Konica Minolta, Inc.; Title of Invention: Transparent Electrode, Organic Electronic Element, and Method for Producing Transparent Electrode ; English translation of Office Action; Total of 9 pages.
(Continued)

*Primary Examiner* — Magali P Slawski
*Assistant Examiner* — Michael Y Sun
(74) *Attorney, Agent, or Firm* — Lucas & Mercanti, LLP; Donald C. Lucas

(57) ABSTRACT

A transparent electrode (1) comprises a transparent substrate (2); a metal conductive layer (4) composed of a metal thin line pattern; and a polymer conductive layer (6) including a conductive polymer containing a polymer acid. The metal conductive layer (4) is formed on/over the transparent substrate (2) and the metal conductive layer (4) is covered with the polymer conductive layer (6). The polymer conductive layer (6) has a surface specific resistance of
(Continued)

10,000Ω/□ or smaller and the polymer acid contains a fluorinated polymer acid and a non-fluorinated polymer acid. In the polymer conductive layer (6) a concentration of the fluorinated polymer acid increases along a direction from the transparent substrate (2) towards the polymer conductive layer (6).

12 Claims, 7 Drawing Sheets

(51) Int. Cl.
　　*H01L 51/52*　　　(2006.01)
　　*H01L 51/00*　　　(2006.01)
(52) U.S. Cl.
　　CPC ...... *H01L 51/5212* (2013.01); *H01L 51/0022* (2013.01); *H01L 51/0037* (2013.01); *H01L 51/5215* (2013.01); *Y02E 10/549* (2013.01); *Y02P 70/521* (2015.11)
(58) Field of Classification Search
　　CPC ..... H01L 51/0022; H05K 1/09; Y02P 70/521; Y02E 10/549
　　See application file for complete search history.

(56) References Cited

FOREIGN PATENT DOCUMENTS

| | | | |
|---|---|---|---|
| JP | 2006-527277 | A | 11/2006 |
| JP | 2007-191715 | A | 8/2007 |
| JP | 2007-221132 | A | 8/2007 |
| JP | 2008-130449 | A | 6/2008 |
| JP | 2008-288102 | A | 11/2008 |
| JP | 2008-546900 | A | 12/2008 |
| JP | 2009-140790 | A | 6/2009 |
| JP | 2011-129449 | A | 6/2011 |
| JP | 2011129449 | * | 6/2011 |
| JP | 2011-171214 | A | 9/2011 |
| JP | WO 2011136022 A1 * | 11/2011 | .......... H01L 51/004 |

OTHER PUBLICATIONS

International Preliminary Report on Patentability and Written Opinion, Japanese and English, dated Apr. 1, 2014 (16 pages).
Notification of Refusal dated Feb. 2, 2016; Patent Application No. 2013-536381; Applied Articles: Art. 29(2), Art. 36; total of 4 pages; English translation of Notification of Refusal; total of 8 pages; Grand Total of 12 pages.

* cited by examiner

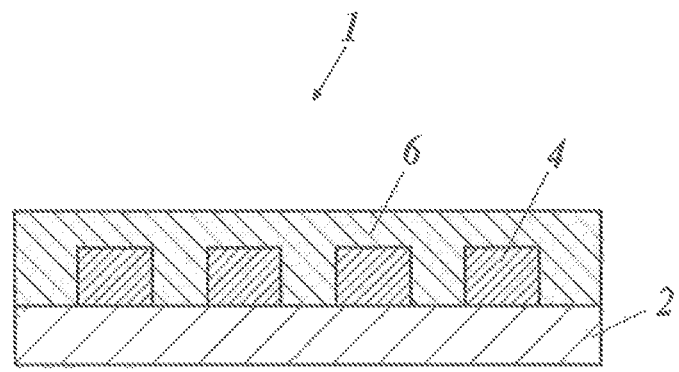

TRANSPARENT ELECTRODE, ORGANIC ELECTRONIC ELEMENT, AND METHOD FOR PRODUCING TRANSPARENT ELECTRODE

CROSS REFERENCE TO RELATED APPLICATION

This Application is a 371 of PCT/JP2012/074887 filed on Sep. 27, 2012 which, in turn, claimed the priority of Japanese Patent Application No. JP2011-211918 filed on Sep. 28, 2011 both applications are incorporated herein by reference.

TECHNICAL FIELD

The present invention relates to a transparent electrode, an organic electronic element, and a method for producing a transparent electrode.

BACKGROUND ART

In recent years, much attention has been paid to organic electronic element, including organic EL element, organic solar cell and so forth, configured by stacking an organic functional layer on an anode using a transparent electrode, and further stacking thereon a cathode. The transparent electrode is understood as an essential constitutive technology in these sorts of elements.

Conventional transparent electrode most popularly used is ITO transparent electrode for its advantages in electro-conductivity and transparency, in the form of a film obtained by depositing, on a transparent substrate, indium-tin composite oxide (ITO) by vacuum evaporation or sputtering.

The ITO-based electrode produced by vacuum evaporation or sputtering, however, suffers from low productivity due to single-substrate-oriented nature of these processes, and poor adaptability to large-area element. The ITO-based electrode which is intrinsically less flexible is also not applicable to elements required to be flexible. In addition, the transparent electrode used for the organic electronic elements has been demanded for larger area and lower resistivity, so that the resistivity of the ITO transparent electrode has been proven to be insufficient.

Therefore in place of the ITO electrode, there has been proposed a transparent metal electrode using metal nanoparticle or CNT, and a transparent polymer using conductive polymer.

The transparent metal electrode, however, has a rough irregularities on the surface thereof, makes it difficult to form thereon a thin hole injection layer, and possibly causes current leakage.

Meanwhile, the transparent polymer electrode, when formed thereon with the hole injection layer, may swell and re-dissolve. This may unfortunately produce dark spot in the organic EL element, and may reduce efficiency due to increase in interface resistance.

To address these problems, there have been proposed structures each having a patterned metal conductive layer and a conductive polymer layer stacked thereon (see Patent Literatures 1 and 2, for example).

These structures have the metal conductive layers smoothened, thereby the current leakage may be suppressed to achieve a uniform conductivity over the plane. The conductive polymer, however, shows a large absorption in the visible light region, so that it is difficult for the transparent electrode to balance the transparency and conductivity.

Aiming at improving the efficiency and reducing the operating voltage of the element, there have been other proposals to use conductive polymers doped with a fluorinated polymer acid for a buffer layer such as the hole injection layer (see Patent Literatures 3, 4 and 5, for example).

While these materials, having large work functions, could improve the hole injection function, they need a buffer layer for facilitating hole injection, preliminarily formed on the transparent electrode typically composed of ITO, and need be formed thinly and uniformly, raising problems of low productivity and large variation in performance of the element.

CITATION LIST

Patent Literature

Patent Literature 1: JP2008-288102A
Patent Literature 2: JP2009-140790A
Patent Literature 3: JP2006-527277A
Patent Literature 4: JP2007-221132A
Patent Literature 5: JP2008-546900A

SUMMARY OF THE INVENTION

Technical Problem

It is therefore a major objective of the present invent-on to provide a transparent electrode which concurrently satisfies the transparency and electro-conductivity and is capable of improving performances of the organic electronic elements when incorporated therein, and a method of manufacturing the same.

Solution to Problem

According to an aspect of the present invention aimed at solving the problem described above, there is provided a transparent electrode which includes:
  a transparent substrate;
  a metal conductive layer composed of a metal thin line pattern; and
  a polymer conductive layer comprising a conductive polymer containing a polymer acid,
  in which the metal conductive layer is formed on/over the transparent substrate and the metal conductive layer is covered with the polymer conductive layer, and
  in which the polymer conductive layer has a surface specific resistance of $10,000\Omega/\square$ or smaller,
  the polymer acid contains a fluorinated polymer acid and a non-fluorinated polymer acid, and
  in the polymer conductive layer, a concentration of the fluorinated polymer acid increases along a direction from the transparent substrate towards the polymer conductive layer.

As described above, according to an aspect of the present invention, a polymer conductive layer composed of a conductive polymer is stacked on a metal conductive layer composed of a metal thin line pattern, and the metal conductive layer is covered with the polymer conductive layer. With this structure, the irregularity on the surface of the metal thin line pattern is smoothened and thereby the current leakage may be suppressed.

According to an aspect of the present invention, the polymer conductive layer with a surface specific resistance of $10,000\Omega/\square$ is stacked on the highly-conductive metal conductive layer, so that the electrode as a whole successfully attains high conductivity and good plane uniformity of conductivity, and can thereby supply current to the organic functional layer in just proportion.

According to an aspect of the present invention, the polymer conductive layer contains, as the polymer acid, a fluorinated polymer acid and a non-fluorinated polymer acid, in which the concentration of the fluorinated polymer acid increases along the direction from the transparent substrate towards the polymer conductive layer. As a consequence, the transparent electrode is now given a hole injection function, and the integrated formation with the electrode will dramatically improve the efficiency and productivity of the element.

The polymer conductive layer preferably contains either one hydroxy group-containing polymer selected from;

a polymer (A) composed of a structural unit (I) containing a hydroxy group; and a polymer (B) composed of the structural unit (I), and a structural unit (II) having no hydroxy group but having an ester or amide bond.

[Chemical Formula 1]

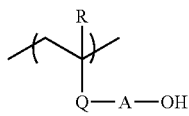
(I)

[Chemical Formula 2]

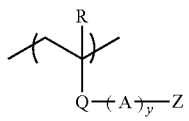
(II)

In the structural unit (I), "R" represents a hydrogen atom or methyl group, and "Q" represents —C(=O)O— or —C(=O)NRa—. "Ra" represents a hydrogen atom or alkyl group, "A" represents a substituted or unsubstituted alkylene group or —(CH$_2$CHRbO)$_x$—CH$_2$CHRb—, "Rb" represents a hydrogen atom or alkyl group, and "x" represents the average number of repeating unit given by an integer from 0 to 100.

In the structural unit (II), "R" represents a hydrogen atom or methyl group, and "Q" represents —C(=O)O— or —C(=O)NRa—. "Ra" represents a hydrogen atom or alkyl group, "A" represents a substituted or unsubstituted alkylene group, or —(CH$_2$CHRbO)$_x$—CH$_2$CHRb—, "Rb" represents a hydrogen atom or alkyl group, "x" represents the average number of repeating unit given by an integer from 0 to 100, "y" represents 0 or 1, and "Z" represents an alkoxy group, —O—C(=O)—Rc, —O—SO$_2$—Rd or —O—SiRe$_3$. Each of "Rc", "Rd" and "Re" represents an alkyl group, perfluoroalkyl group or aryl group.

According to this configuration, by containing at least one hydroxy group-containing polymer selected from; a polymer (A) composed of a structural unit (I) containing a hydroxy group; and a polymer (B) composed of the structural unit (I), and a structural unit (II) having no hydroxy group but having an ester or amide bond, the polymer conductive layer will successfully reduce a necessary amount of conductive polymer without impairing the conductivity of the polymer conductive layer. Accordingly, the transparent electrode well balanced between high conductivity and transparency may be obtained.

Further according to this configuration, by containing at least one of polymer (A) and polymer (B), the polymer conductive layer will be improved in the strength, water resistance and solvent resistance, and thereby the transparent electrode may be suppressed from being damaged or degraded in the performance in the process of manufacture of the organic electronic element. By using the transparent electrode, it also becomes possible to improve the performance, in particular the service life, of the organic electronic element.

According to another aspect of the present invention, there is provided a method for producing a transparent electrode, the method includes: forming, on a transparent substrate, a metal conductive layer by printing a metal thin line pattern; and applying an application liquid containing a fluorinated polymer acid and a non-fluorinated polymer acid, over the transparent substrate and the metal conductive layer, so as to form a polymer conductive layer with a surface specific resistance of 10,000Ω/□ or smaller, to thereby cover the metal conductive layer.

Advantageous Effects of Invention

According to the present invention, it becomes now possible to provide a transparent electrode which concurrently satisfies the transparency and electro-conductivity, and to improve performances of the organic electronic elements incorporated with the transparent electrode.

BRIEF DESCRIPTION OF DRAWINGS

FIG. 1 is a cross sectional view illustrating a schematic configuration of a transparent electrode.

DESCRIPTION OF EMBODIMENTS

Preferable embodiments of the present invention will be explained below with reference to attached drawings.

<<Transparent Electrode (1)>>

As illustrated in FIG. 1, a transparent electrode 1 is mainly configured by a transparent substrate 2, a metal conductive layer 4 and a polymer conductive layer 6.

Figure 2A:
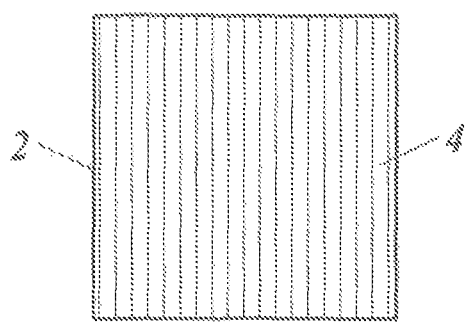
FIG. 2A is a plan view illustrating an exemplary pattern of a metal conductive layer of the transparent electrode.
Figure 2B:
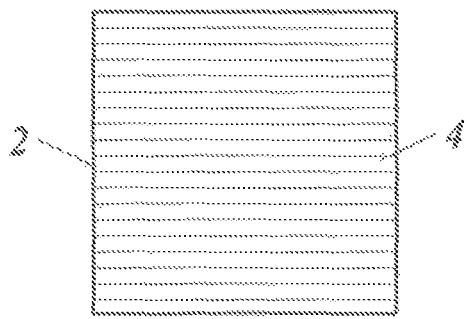
FIG. 2B is a drawing illustrating a modified example of FIG. 2A.
Figure 2C:
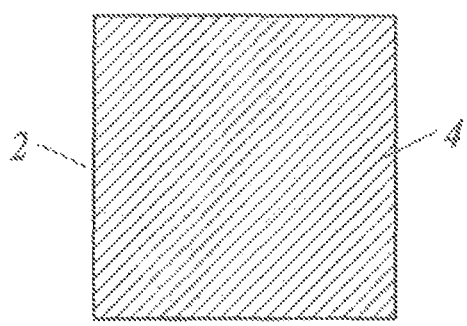
FIG. 2C is a drawing illustrating a modified example of FIG. 2A.
Figure 2D:
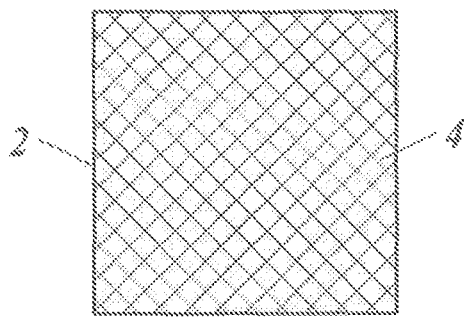
FIG. 2D is a drawing illustrating a modified example of FIG. 2A to FIG. 2C.

On/over the transparent substrate 2, the metal conductive layer 4 composed of a thin line pattern composed of a metal particle is formed. In the metal conductive layer 4, the thin line pattern composed of a metal particle may be formed into stripes as illustrated in FIG. 2A to FIG. 2C, or into a mesh as illustrated in FIG. 2D.

On/over the metal conductive layer 4, the polymer conductive layer 6 composed of a conductive polymer is formed. The polymer conductive layer 6 is formed flat so as to cover the surface of the metal conductive layer 4 and the surface of the transparent substrate 2 exposed through the metal conductive layer 4.

<<Metal Conductive Layer (4)>>

The metal conductive layer in the present invention contains a metal particle, and formed into a predetermined pattern on/over the transparent glass substrate. With this configuration, the transparent substrate is given an opaque conductive portion containing a metal particle and a transparent window portion, and can yield the transparent electrode excellent both in transparency and conductivity.

The metal particle is not specifically limited so long as it is excellent in conductivity and is selectable, for example, from metals such as gold, silver, copper, iron, nickel and chromium and from alloys. In particular from the viewpoint of readiness of formation of pattern as described later, the metal material preferably has the form of nano-particle or nano-wire. The metal particle is preferably composed of silver, from the viewpoints of conductivity and stability.

While not specifically limited, the metal conductive layer preferably has a stripe-patterned or mesh-patterned conductive portion, and has an aperture ratio of 80% or larger from the viewpoint of transparency. The aperture ratio is now referred to as percentage of area of a portion other than the opaque conductive portion to the total area. For example, given the line width of the conductive portion as 100 μm, and the line pitch as 1 mm, the stripe pattern will have an aperture ratio of approximately 90%. The line width of the pattern is preferably 10 to 200 μm. Within this range, desired levels of conductivity and transparency are obtainable. The line height is preferably 0.2 to 2.0 μm. Within this range, a desired level of conductivity is obtainable.

Methods of forming the electrode having the stripe-patterned or mesh-patterned conductive portion include a method of applying, by printing, a metal particle-containing ink through a patterned plate for gravure printing, flexographic printing or screen printing, so as to form a predetermined pattern; and a method of directly forming a pattern by ink jet printing. Screen printing and ink jet printing are preferable, from the viewpoints of drawability of thin line, conductivity of metal thin line, and productivity.

The metal conductive layer is preferably annealed, so long as the transparent substrate will not be damaged. The annealing is particularly preferable since it promotes fusion of metal grains, to thereby make the metal conductive layer conductive.

<<Polymer Conductive Layer (6)>>

The polymer conductive layer in the present invention is stacked on/over the metal conductive layer composed of the metal thin line pattern, so as to cover the metal conductive layer. With this configuration, the electrode will obtain a uniform conductivity over the entire plane, the surface irregularity of the metal conductive layer may be smoothened, and thereby the leakage of current of the element may be suppressed.

The polymer conductive layer in the present invention is composed of a conductive polymer (including polymer acid), and has a surface specific resistance of 10,000Ω/□ or smaller, and preferably smaller than 5,000 Ω/□.

In the polymer conductive layer, the polymer acid in the conductive polymer contains a fluorinated polymer acid and a non-fluorinated polymer acid, and the concentration of the fluorinated polymer acid increases along the direction from the transparent substrate towards the polymer conductive layer. Accordingly, the transparent electrode with a hole injection function may be formed in an integrated manner, and thereby the efficiency and productivity of the element may be improved dramatically.

The status of "the concentration of the fluorinated polymer acid increases along the direction from the transparent substrate towards the polymer conductive layer" suffices that the concentration of the fluorinated polymer acid in the polymer conductive layer substantially increases from the transparent substrate side towards the opposite side (surface (exposed surface) side of the polymer conductive layer). "Substantially increases" in the context herein includes the case where the concentration is kept constant in the middle way of the thickness-wise direction of the polymer conductive layer, and the case where the concentration temporarily decreases on the exposed surface side of the polymer conductive layer in the thickness-wise direction as compared with the transparent substrate side. It is, however, preferable that the concentration of the fluorinated polymer acid does not decrease, even temporarily, on the exposed surface side of the polymer conductive layer in the thickness-wise direction of the polymer conductive layer compared with the transparent substrate side.

While methods of creating the concentration gradient of the fluorinated polymer acid are not specifically limited as mentioned above, the gradient is obtainable by forming the polymer conductive layer by a wet process using an application liquid containing the conductive polymer (containing the fluorinated polymer acid and the non-fluorinated polymer acid).

For example, gravure printing, flexographic printing or ink jet printing is adoptable.

From the viewpoint of forming the concentration gradient of the fluorinated polymer acid, a wet thickness of the film during printing is preferably 1 μm or larger, and more preferably 5 μm or larger.

The concentration gradient of the fluorinated polymer acid is created supposedly because the fluorinated polymer acid has a surface energy smaller than that of other materials including the non-fluorinated polymer acid, and orients in the liquid phase towards the surface, and thereby localizes in the vicinity of the surface.

From the viewpoint of hole injection function, 50% (by weight) or more, and more preferably 60% or more of the total fluorinated polymer acid is preferably localized within a 30% range of the relative thickness from the surface of the polymer conductive layer.

From the viewpoint of surface orientation, the fluorinated polymer acid preferably has a surface energy of 30 mN/m or smaller, and more preferably 25 mN/m or smaller. The surface energy is controllable based on the ratio of fluorination of the fluorinated polymer acid, i.e. the surface energy may be reduced by elevating the ratio of fluorination.

Another possible method of creating the concentration gradient of the fluorinated polymer acid relates to a method of utilizing difference of solubility of the polymer acids into solvent.

The polymer layer is formed by preparing and then applying a solution using a solvent in which the fluorinated polymer acid and the non-fluorinated polymer acid show different levels of solubility.

When the solvent is removed by drying, the concentration distribution of the polymer acid may be created based on the magnitude of solubility.

The solubility is also controllable based on the ratio of mixing of a plurality of solvents or based on drying speed.

(1) Conductive Polymer

In the present invention, the polymer conductive layer contains the conductive polymer.

The conductive polymer used in the present invention contains a π-conjugated conductive polymer and the polymer acid. This sort of conductive polymer is readily manufacturable by allowing a precursor monomer, capable of forming the π-conjugated conductive polymer described later, to polymerize based on chemical oxidation under the presence of an appropriate oxidant, oxidizing catalyst and the polymer acid described later.

(1.1) π-Conjugated Conductive Polymer

The π-conjugated conductive polymer usable in the present invention is not specifically limited, and is selectable from chain-like conductive polymers such as polythiophenes (including basic polythiophene, the same will apply hereinafter), polypyrroles, polyindoles, polycarbazoles, polyanilines, polyacetylenes, polyfurans, polyparaphenylene vinylenes, polyazulenes, polyparaphenylenes, polyparaphenylene sulfides, polyisothianaphthenes, and polythiazyls. Among them, polythiophenes and polyanilines are preferable, from the viewpoints of conductivity, transparency, and stability. Polyethylene dioxythiophene is most preferable.

(1.1.1) Precursor Monomer of π-Conjugated Conductive Polymer

Precursor monomer used for forming the π-conjugated conductive polymer has an intramolecular π-conjugation system, and forms, after being polymerized with the aid of an appropriate oxidant, a π-conjugation system in the principal chain of the product. The precursor monomer is exemplified by pyrroles and derivatives thereof, thiophenes and derivatives thereof, and anilines and derivatives thereof.

Examples of the precursor monomer include pyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxypyrrole, 3-methyl-4-carboxypyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole, thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylenedioxythiophene, 3,4-propylenedioxythiophene, 3,4-butenedioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene, aniline, 2-methylaniline, 3-isobutylaniline, 2-anilinesulfonic acid, and 3-anilinesulfonic acid.

(1.2) Polymer Acid

The polymer acid used in the present invention is a substituted or unsubstituted polyalkylene, substituted or unsubstituted polyalkenylene, substituted or unsubstituted polyimide, substituted or unsubstituted polyamide, substituted or unsubstituted polyester, or any copolymer of them, and is composed of a structural unit having an anionic group and a structural group having no anionic group.

The polymer acid is a solubilizing polymer capable of solubilizing the π-conjugated conductive polymer into solvent. The anionic group of the polymer acid functions as a dopant for the π-conjugated conductive polymer, and improves the conductivity and heat resistance of the π-conjugated conductive polymer.

While the anionic group of the polymer acid may be any functional group so long as it can be doped by chemical oxidation into the π-conjugated conductive polymer, it is particularly preferable, from the viewpoints of readiness of preparation and stability, to select it among from monosubstituted sulfuric ester group, monosubstituted phosphoric ester group, phosphoric acid group, carboxy group, and sulfo group. From the viewpoint of efficacy of doping of the functional group into the π-conjugated conductive polymer, sulfo group, monosubstituted sulfuric ester group, and carboxy group are more preferable.

Specific examples of the polymer acid include polyvinylsulfonic acid, polystyrenesulfonic acid, polyallylsulfonic acid, polyethyl acrylate sulfonate, polybutyl acrylate sulfonate, poly-2-acrylamide-2-methylpropanesulfonic acid, polyisoprenesulfonic acid, polyvinylcarboxylic acid, polystyrenecarboxylic acid, polyallylcarboxylic acid, polyacrylcarboxylic acid, polymethacrylcarboxylic acid, poly-2-acrylamide-2-methylpropanecarboxylic acid, polyisoprenecarboxyiic acid, and polyacrylic acid. The polymer acid may be a homopolymer of any of these polymer acids, or may be a copolymer of two or more species of them.

The polymer acid, if being a compound having sulfonic acid, is preferable since it can promote a crosslinking reaction based on condensation of the hydroxy group-containing polymer described later.

Among them, further preferable examples include polystyrenesulfonic acid, polyisoprenesulfonic acid, polyethyl acrylate sulfonic acid, and polybutyl acrylate sulfonic acid. These polymer acids are highly compatible with the hydroxy group-containing polymer, and can further elevate the conductivity of the resultant conductive polymer.

The degree of polymerization of the polymer acid is preferably 10 to 100,000 in terms of the number of monomer units and more preferably 50 to 10,000 from the viewpoint of solvent solubility and conductivity.

Possible methods of preparing the polymer acid include a method of directly introducing an anionic group into the anionic group-free polymer with the aid of an acid, a method of sulfonating the anionic group-free polymer using a sulfonating agent, and a method based on polymerization of an anionic group-containing polymerizable monomer.

The method based on polymerization of an anionic group-containing polymerizable monomer is exemplified by a method of allowing the anionic group-containing polymerizable monomer to polymerize in an solvent under the presence of an oxidant and/or polymerization catalyst, based on oxidative polymerization or radical polymerization.

More specifically, a predetermined amount of an anionic group-containing polymerizable monomer is dissolved into a solvent, the mixture is kept at a constant temperature, added with a solution obtained by preliminarily dissolving a predetermined amount of oxidant and/or polymerization catalyst into a solvent and the mixture is allowed to react for a predetermined length of time. The thus obtained polymer after the reaction is diluted with a solvent to a proper concentration. In this method of preparation, the anionic group-containing polymerizable monomer may alternatively be copolymerized with the anionic group-free polymerizable monomer.

The oxidant, oxidizing catalyst and solvent used for the polymerization of the anionic group-containing polymerizable monomer are same as those used for the polymerization of the precursor monomer for forming the π-conjugated conductive polymer.

If the thus obtained polymer is a salt of the polymer acid, it is preferably converted to acid. Methods of conversion into the anion acid are exemplified by ion exchange using an ion exchange resin, dialysis, and ultrafiltration. Among them, ultrafiltration is preferable in view of simplicity of the operation.

(1.2.1) Fluorinated Polymer Acid

The fluorinated polymer acid used in the present invention includes those having a part of the principal chain of the above-described polymer acid substituted by fluorine atoms, or those introduced with a fluorine-containing group as the side chain thereof.

A group represented by the formula below is preferably introduced as the fluorine-containing group to be introduced as the side chains.

—(O—CF$_2$CFRf)a-O—CF$_2$CFR'fAx    (F0)

In the formula (F0), each of "Rf and R'f" is independently selected from F, Cl and C$_{1-10}$ perfluorinated alkyl group.

"a" is 0, 1 or 2.

"Ax" represents a terminal group. Ax is exemplified by H and anionic group, preferably represents PO$_4$X (phosphoric acid group), COOX (carboxy group) or SO$_3$X (sulfonic acid group), and more preferably represents SO$_3$X (sulfonic acid group).

"X" represents H, Li, Na, K or N(R$_1$)(R$_2$)(R$_3$)(R$_4$), and preferably represents H. X may be polyvalent.

Each of "R$_1$, R$_2$, R$_3$ and R$_4$" may be same or different. R$_1$, R$_2$, R$_3$ and R$_4$ are exemplified by H and alkyl group, and preferably by H, CH$_3$ and C$_2$H.

The formula (F0) is preferably represented by the formula (F1).

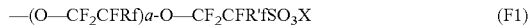

—(O—CF$_2$CFRf)a-O—CF$_2$CFR'fSO$_3$X    (F1)

Preferable examples of the fluorinated polymer acid have a perfluorocarbon skeleton represented by the formula below, and side chains.

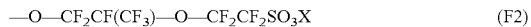

—O—CF$_2$CF(CF$_3$)—O—CF$_2$CF$_2$SO$_3$X    (F2)

In the formula (F2), "X" is as defined above.

The fluorinated polymer acid of this type is disclosed in U.S. Pat. No. 3,282,875, and is manufactured by copolymerizing tetrafluoroethylene (TFE) and perfluorinated vinyl ether CF$_2$=CF—O—CF$_2$CF(CF$_3$)—O—CF$_2$CF$_2$SO$_2$F and perfluoro(3,6-dioxa-4-methyl-7-octentsulfonyl fluoride) (PDMOF), hydrolyzing the sulfonyl fluoride groups to convert them into sulfonic acid groups, and optionally converting them into a desired ionic form by ion exchange.

Preferable examples of the polymers of the type disclosed in U.S. Pat. Nos. 4,358,545 and 4,940,525 have a side chain —O—CF$_2$CF$_2$SO$_3$X (in the formula, X is as defined previously).

The polymer is manufacturable by copolymerizing tetrafluoroethylene (TFE), perfluorinated vinyl ether CF$_2$=CF—O—CF$_2$CF$_2$SO$_2$F, and perfluoro (3-oxa-4-pentenesulfonyl fluoride) (POPF), followed by hydrolysis, and optional ion exchange.

Synthesis of the fluorinated polymer acid is known to the public.

The fluorinated polymer acid is producible as a colloidal water-based dispersion. It is also obtainable in the form of dispersion in other solvent. The solvent is exemplified by, but not limited to, alcohol, water-soluble ether such as tetrahydrofuran, mixture of water-soluble ether, and combinations of them. The dispersion may be prepared by using the polymer in the form of acid. U.S. Pat. Nos. 4,433,082 and 6,150,426 disclose methods of producing the water-based alcohol dispersion. After being produced, the dispersion may be adjusted in terms of concentration and composition of the ingredients, by any method known in the art.

The water-based dispersion of the fluorinated polymer acid is exemplified by Nafion (from DuPont) which contains perfluorosulfonic acid group, and Flemion (from Asahi Glass Co., Ltd.) composed of perfluoro-type vinyl ether containing carboxylic acid group.

The fluorinated polymer acid preferably has a weight-average molecular weight in the range from 10,000 to 4,000,000, and particularly from 100,000 to 2,000,000. The water-based dispersion of the fluorinated polymer acid preferably has a particle size of 2 nm to 140 nm, and particularly 2 nm to 30 nm.

Ratio by weight of π-conjugated conductive polymer and polymer acid contained in the conductive polymer, given in the form of "π-conjugated conductive polymer":"polymer acid", is preferably 1:1 to 1:20. From the viewpoints of conductivity and dispersibility, the ratio is more preferably 1:2 to 1:10.

The oxidant used when the conductive polymer according to the present invention is obtained by polymerizing, based on chemical oxidation, the precursor monomer for forming the π-conjugated conductive polymer under the presence of the polymer acid, is any of the oxidants suitable for oxidative polymerization of pyrrole, typically described in *J. Am. Soc.*, 85, 454(1963). For practical reasons, it is preferable to use inexpensive and readily handleable oxidant, exemplified by iron (III) salts such as FeCl$_1$ and Fe(ClO$_4$)$_3$; iron (III) salts of organic acid, and inorganic acid which contains organic residue; hydrogen peroxide; potassium bichromate; alkali metal persulfates (for example, potassium persulfate, sodium persulfate); ammonia; alkali metal perborates; potassium permanganate; and copper salt such as copper tetrafluoroborate. In addition, also air or oxygen may be used as the oxidant as required, under a catalytic amount of metal ion of, for example, iron, cobalt, nickel, molybdenum or vanadium. Use of persulfate salt, organic acid, and iron (III) salt of organic residue-containing inorganic acid take large advantages by virtue of their non-corrosive nature.

Examples of the iron (III) salt of organic residue-containing inorganic acid include iron (III) salts of sulfuric half ester of C$_{1-20}$ alkanol, such as lauryl sulfate; C$_{1-20}$ alkylsulfonic acid such as methane- or dodecanesulfonic acid; aliphatic C$_{1-20}$ carboxylic acid, such as 2-ethylhexylcarboxylic acid; aliphatic perfluorocarboxylic acid, such as tri fluoroacetic acid and perfluorooctanoic acid; aliphatic dicarboxylic acid, such as oxalic acid; and in particular aromatic sulfonic acid optionally substituted by $C_{1-20}$ alkyl group, such as benzensulfonic acid, p-toluenesulfonic acid and dodecylbenzene sulfonic acid.

Any commercially available materials are preferably used for the conductive polymer.

For example, a conductive polymer composed of poly(3, 4-ethylenedioxythiophene) and polystyrenesulfonic acid (abbreviated as PEDOT-PSS) is commercially available from H. C. Starck GmbH under the name of Clevios Series, from Aldrich under the names of PEDOT-PSS 483095 and 560596, and from Nagase ChemteX Corporation under the name of Denatron Series. Also polyaniline is launched from Nissan Chemical Industries, Ltd. under the name of Ormecon Series.

Also these materials are preferably used in the present invention.

(2) Second Dopant

A water-soluble organic compound may be contained as a second dopant.

The water-soluble organic compound usable in the present invention is arbitrarily selectable from publicly known products, without special limitation, and is exemplified by oxygen-containing compound.

The oxygen-containing compound is not specifically limited so long as it contains oxygen, and is exemplified by hydroxy group-containing compound, carbonyl group-containing compound, ether group-containing compound, and sulfoxide group-containing compound.

The hydroxy group-containing compound is exemplified by ethylene glycol, diethylene glycol, propylene glycol, trimethylene glycol, 1,4-butanediol, and glycerin. Among them, ethylene glycol and diethylene glycol are preferable. The carbonyl group-containing compound is exemplified by isophorone, propylene carbonate, cyclohexanone, and γ-butyrolactone. The ether group-containing compound is exemplified by diethylene glycol monoethyl ether. The sulfoxide group-containing compound is exemplified by dimethylsulfoxide.

Only a single species of them may independently be used, or two or more species may be used in combination. It is preferable to use at least one species selected from dimethylsulfoxide, ethylene glycol, and diethylene glycol.

(2.1) Hydroxy Group-Containing Polymer

The polymer conductive layer preferably contains at least a conductive polymer and a hydroxy group-containing polymer, and is formed by applying a dispersion containing them on/over the metal conductive layer configured to include an insulating layer, followed by drying.

The hydroxy group-containing polymer is a polymer (A) composed of a structural unit (I) having a hydroxy group; or a polymer (B) composed of the structural unit (I), and a structural unit (II) having no hydroxy group but having an ester or amide bond.

[Chemical Formula 3]

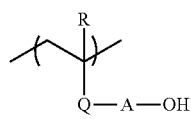

(I)

[Chemical Formula 4]

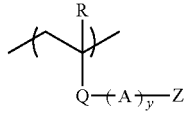

(II)

(2.2.1) Structural Unit (I)

in the structural unit (I), R represents a hydrogen atom or methyl group. Q represents —C(=O)C— or —C(=O)NRa—, and Ra represents a hydrogen atom or alkyl group. The alkyl group is preferably a $C_{1-5}$ straight-chain, or branched alkyl group, and more preferably a methyl group. The alkyl group may be substituted by a substituent. Examples of the substituent include alkyl group, cycloalkyl group, aryl group, heterocycloalkyl group, heteroaryl group, hydroxy group, halogen atom, alkoxy group, alkylthio group, arylthio group, cycloalkoxy group, aryloxy group, acyl group, alkylcarbonamide group, arylcarbonamide group, alkylsulfonamide group, arylsulfonamide group, ureido group, aralkyl group, nitro group, alkoxycarbonyl group, aryloxycarbonyl group, aralkyloxycarbonyl group, alkylcarbamoyl group, arylcarbamoyl group, alkylsulfamoyl group, arylsulfamoyl group, acyloxy group, alkenyl group, alkynyl group, alkylsulfonyl group, arylsulfonyl group, alkyloxysulfonyl group, aryloxysulfonyl group, alkylsulfonyloxy group, and arylsulfonyloxy group. Among them, hydroxy group and alkyloxy group are preferable.

The alkyl group may be branched, preferably has 1 to 20 carbon atoms, more preferably has 1 to 12 carbon atoms, and furthermore preferably has 1 to 8 carbon atoms. Examples of the alkyl group include methyl group, ethyl group, propyl group, isopropyl group, butyl group, t-butyl group, hexyl group, and octyl group.

The cycloalkyl group preferably has 3 to 20 carbon atoms, more preferably has 3 to 12 carbon atoms, and furthermore preferably has 3 to 8 carbon atoms. Examples of the cycloalkyl group include cyclopropyl group, cyclobutyl group, cyclopentyl group and cyclohexyl group. The alkoxy group may be branched, preferably has 1 to 20 carbon atoms, more preferably has 1 to 12 carbon atoms, furthermore preferably has 1 to 6 carbon atoms, and most preferably has 1 to 4 carbon atoms. Examples of the alkoxy group include methoxy group, ethoxy group, 2-methoxyethoxy group, 2-methoxy-2-ethoxyethoxy group, butyloxy group, hexyloxy group and octyloxy group, wherein ethoxy group is preferable. The alkylthio group may be branched, preferably has 1 to 20 carbon atoms, more preferably has 1 to 12 carbon atoms, furthermore preferably has 1 to 6 carbon atoms, and most preferably has 1 to 4 carbon atoms. Examples of the alkylthio group include methylthio group and ethylthio group. The arylthio group preferably has 6 to 20 carbon atoms, and more preferably has 6 to 12 carbon atoms. Examples of the arylthio group include phenylthio group and naphthylthio group. The cycloalkoxy group preferably has 3 to 12 carbon atoms, and more preferably has 3 to 8 carbon atoms. Examples of the cycloalkoxy group include cyclopropoxy group, cyclobutyloxy group, cyclopentyloxy group and cyclohexyloxy group. The aryl group preferably has 6 to 20 carbon atoms, and more preferably has 6 to 12 carbon atoms. Examples of the aryl group include phenyl group and naphthyl group. The aryloxy group preferably has 6 to 20 carbon atoms, and more preferably has 6 to 12 carbon atoms. Examples of the aryloxy group include phenoxy group and naphthoxy group. The heterocycloalkyl group preferably has 2 to 10 carbon atoms, and more preferably has 3 to 5 carbon atoms. Examples of the heterocycloalkyl group include piperidino group, dioxanyl group and 2-morpholinyl group. The heteroaryl group preferably has 3 to 20 carbon atoms, and more preferably has 3 to 10 carbon atoms. Examples of the heteroaryl group include thienyl group and pyridyl group. The acyl group preferably has 1 to 20 carbon atoms, and more preferably has 1 to 12 carbon atoms. Examples of the acyl group include formyl group, acetyl group, and benzoyl group. The alkylcarbonamide group preferably has 1 to 20 carbon atoms, and more preferably has 1 to 12 carbon atoms. Examples of the alkylcarbonamide group include acetamide group. The arylcarbonamide group preferably has 1 to 20 carbon atoms, and more preferably has 1 to 12 carbon atoms. Examples of the arylcarbonamide group include benzamide group. The alkylsulfonamide group preferably has to 20 carbon atoms, and more preferably has 1 to 12 carbon atoms. Examples of the sulfonamide group include methanesulfonamide group. The arylsulfonamide group preferably has 1 to 20 carbon atoms, and more preferably has 1 to 12 carbon atoms. Examples of the arylsulfonamide group include benzenesulfonamide group and p-toluenesulfonamide group. The aralkyl group preferably has 7 to 20 carbon atoms, and more preferably has 7 to 12 carbon atoms. Examples of the aralkyl group include benzyl group, phenethyl group and naphthylmethyl group. The alkoxycarbonyl group preferably has 1 to 20 carbon atoms, and more preferably has 2 to 12 carbon atoms. Examples of the alkoxycarbonyl group include methoxycarbonyl group. The aryloxycarbonyl group preferably has 7 to 20 carbon atoms, and more preferably has 7 to 12 carbon atoms. Examples of the aryloxycarbonyl group include phenoxycarbonyl group. The aralkyloxycarbonyl group preferably has 8 to 20 carbon atoms, and more preferably has 8 to 12 carbon atoms. Examples of the aralkyloxycarbonyl group include benzyloxycarbonyl group. The acyloxy group preferably has 1 to 20 carbon atoms, and more preferably has 2 to 12 atoms. Examples of the acyloxy group include acetoxy group and benzoyloxy group. The alkenyl group preferably has 2 to 20 carbon atoms, and more preferably has 2 to 12 carbon atoms. Examples of the alkenyl group include vinyl group, allyl group and isopropenyl group. The alkynyl group preferably has 2 to 20 carbon atoms, and more preferably has 2 to 12 carbon atoms. Examples of the alkynyl group include ethynyl group. The alkylsulfonyl group preferably has 1 to 20 carbon atoms, and more preferably has 1 to 12 carbon atoms. Examples of the alkylsulfonyl group include methylsulfonyl group, and ethylsulfonyl group. The arylsulfonyl group preferably has 6 to 20 carbon atoms, and more preferably has 6 to 12 carbon atoms. Examples of the arylsulfonyl group include phenylsulfonyl group, and naphthylsulfonyl group. The alkyloxysulfonyl group preferably has 1 to 20 carbon atoms, and more preferably has 1 to 12 carbon atoms. Examples of the alkyloxysulfonyl group include methoxysulfonyl group, and ethoxysulfonyl group. The aryloxysulfonyl group preferably has 6 to 20 carbon atoms, and more preferably has 6 to 12 carbon atoms. Examples of the aryloxysulfonyl group include phenoxysulfonyl group, and naphthoxysulfonyl group. The alkylsulfonyloxy group preferably has 1 to 20 carbon atoms, and more preferably has 1 to 12 carbon atoms. Examples of the alkylsulfonyloxy group include methylsulfonyloxy group, and ethyl sulfonyloxy group.

The arylsulfonyloxy group preferably has 6 to 20 carbon atoms, and more preferably has 6 to 12 carbon atoms. Examples of the arylsulfonyloxy group include phenylsulfonyloxy group, and naphthylsulfonyloxy group. The substituents may be same or different. These substituents may further be substituted.

In the structural unit (I), A represents a substituted or unsubstituted alkylene group, or (CH$_2$CHRbO)x-CH$_2$CHRb—. The alkylene group preferably has 1 to 5 carbon atoms, and is more preferably ethylene group or propylene group. These alkylene groups may be substituted by the substituents described above. $R_b$ represents a hydrogen atom or alkyl group. The alkyl group is preferably a $C_{1-5}$ straight-chain, or branched alkyl group, and preferably a methyl group. These alkyl groups may be substituted by the substituent described above. X represents an average number of repeating unit given by an integer from 0 to 100, preferably 1 to 100, and more preferably 1 to 10. Since the number of repeating units shows a distribution, so that the notation is defined to represent average values, which may be given up to the first decimal place.

(2.2.2) Structural Unit (II)

In the structural unit (II), R, Q, Ra, A, Rb, and x are synonymous to those defined in the structural unit (I).

In the structural unit (II), y represents 0 or 1. Z represents an alkoxy group, —O—C(=O)—Rc, —O—SO$_2$—Rd, or —O—SiRe$_3$, wherein the alkoxy group preferably has 1 to 12 carbon atoms, more preferably be a methoxy group or ethoxy group, and furthermore preferably be a methoxy group. These alkoxy groups may be substituted by the substituents described above. Each of Rc, Rd and Re represents an alkyl group, perfluoroalkyl group or aryl group, wherein the alkyl group preferably has 1 to 12 carbon atoms, more preferably be a methyl group or ethyl group, and furthermore preferably be a methyl group. These alkyl groups may be substituted by the substituents described above. The perfluoroalkyl group preferably has 1 to 8 carbon atoms, more preferably be a trifluoromethyl group or pentafluoroethyl group, and furthermore preferably be a trifluoromethyl group. The aryl group is preferably a phenyl group or tolyl group, and more preferably be a tolyl group. These alkyl groups, perfluoroalkyl groups, and aryl groups may be substituted by the substituent described above.

Representative and specific examples of the structural unit (I) and the structural unit (II) are shown below, without limiting the present invention.

[Chemical Formula 5]

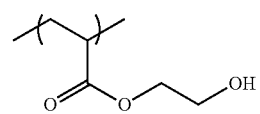

I-1

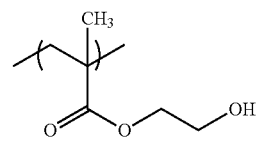

I-2

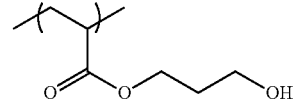

I-3

I-4
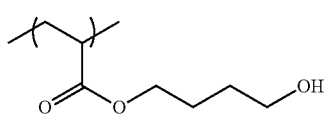
I-5
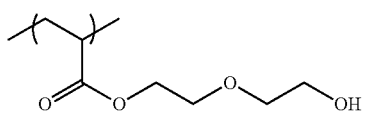
I-6
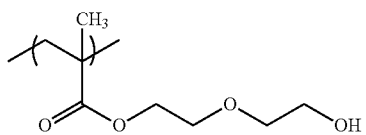
I-7
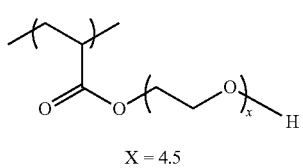
X = 4.5
I-8
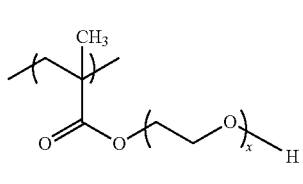
X = 4.5
I-9
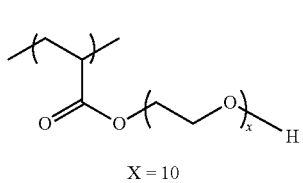
X = 10
I-10
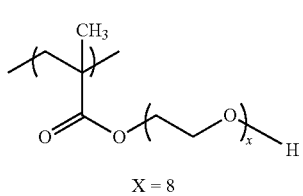
X = 8
I-11
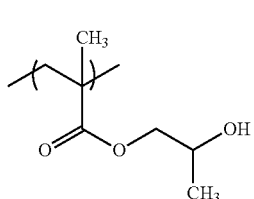
I-12
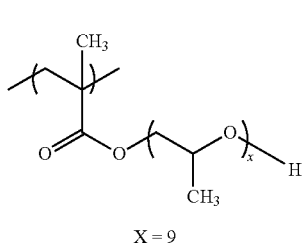
X = 9
I-13
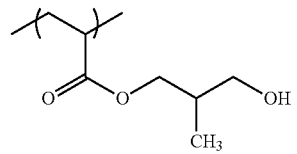
I-14
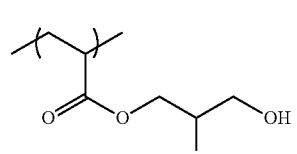
I-15
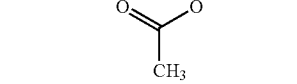
I-16
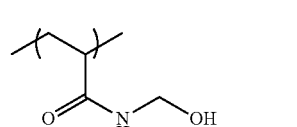
I-17
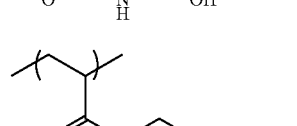
I-18
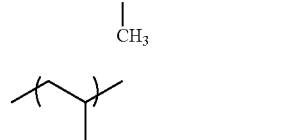
I-19
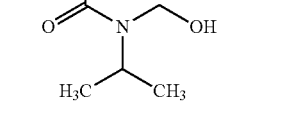
I-20
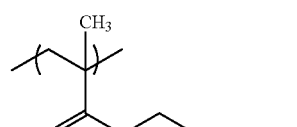
I-21
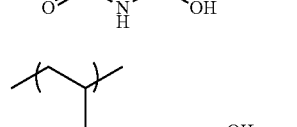
[Chemical Formula 6]
II-1
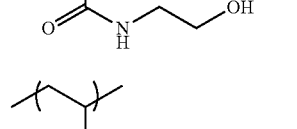

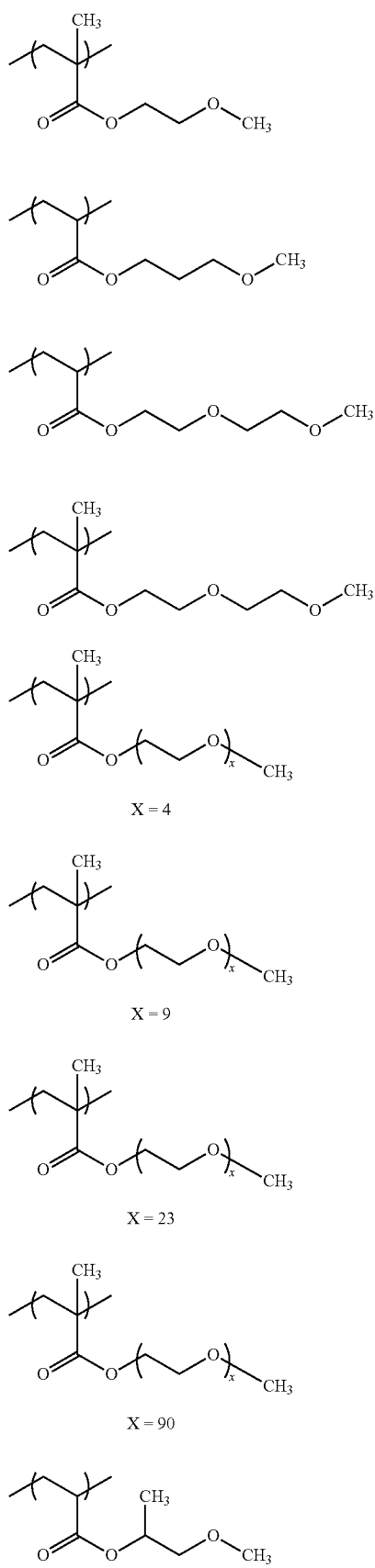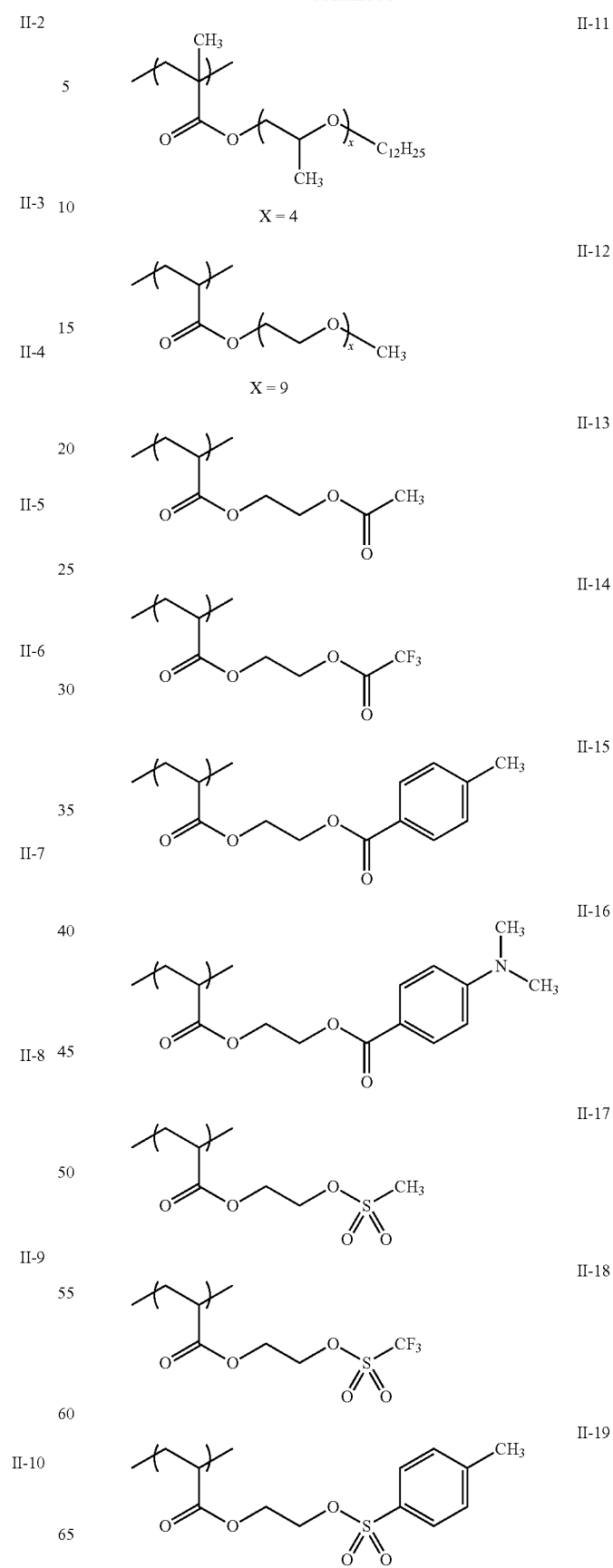

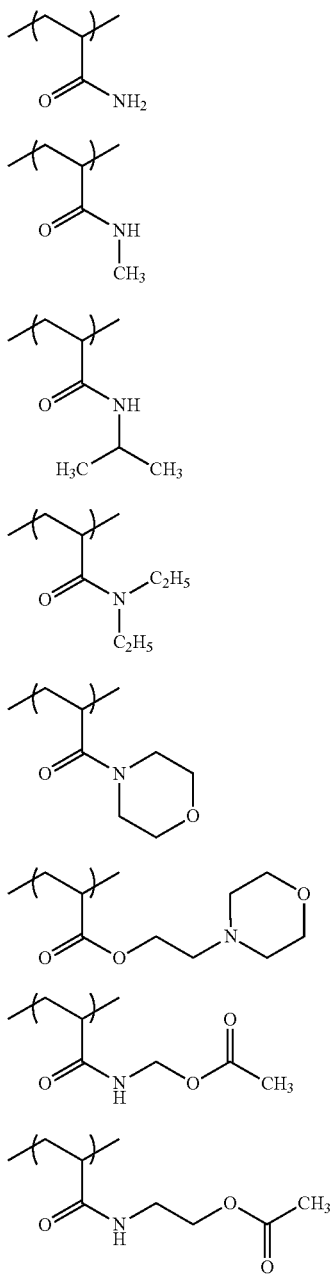

The polymer conductive layer may be formed not only by printing such as the above-mentioned gravure printing, flexographic printing, and screen printing but also by applying methods such as roll coating, bar coating, dip coating, spin coating, casting, die coating, blade coating, bar coating, gravure coating, curtain coating, spray By containing either one of the above-mentioned polymer (A) or polymer (B) as a hydroxy group-containing polymer, the conductive polymer will be enhanced in the conductivity and the polymer conductive layer may obtain a high conductivity.

The polymer conductive layer is stacked on the metal conductive layer, not only to achieve high smoothness of the surface of the metal conductive layer but also to achieve high transparency by virtue of high transparency of the hydroxy group-containing polymer, which has not been attainable by the conductive polymer alone. In addition, crosslinking which occurs herein among the hydroxy group-containing polymer, based on dehydration condensation, improves the strength of the film, such as water resistance and solvent resistance.

As for ratio of the conductive polymer and the hydroxy group-containing polymer in the polymer conductive layer, content of the hydroxy group-containing polymer is preferably 30 parts by mass to 900 parts by mass, per 100 parts by mass of the conductive polymer. From the viewpoint of preventing current leakage, enhancing conductivity of the hydroxy group-containing polymer, and transparency, the content of the hydroxy group-containing polymer is preferably 100 parts by mass or more.

Dry thickness of the polymer conductive layer is preferably 30 to 2,000 nm. From the viewpoint of conductivity, the thickness is more preferably 100 nm or larger and from the viewpoint of surface smoothness, the thickness is more preferably 200 nm or larger. Meanwhile, from the viewpoint of transparency, the thickness is more preferably 1,000 nm or smaller.

After application, the polymer conductive layer may be dried properly.

While conditions for drying are not specifically limited, the drying is preferably conducted in a temperature range not damaging the base or conductive layer. The drying is conducted typically at 80 to 120° C. for 10 seconds to 10 minutes. Aiming at promoting a dehydration condensation reaction, the drying may be followed by heating at 100 to 250° C. for 10 seconds to 60 minutes.

In the present invention, the crosslinking reaction of the hydroxy group-containing polymer may be promoted and completed, using an acid catalyst. The acid catalyst usable herein is hydrochloric acid, sulfuric acid, ammonium sulfate and so forth. By using a sulfo group-containing polyanion as the dopant, directed to use as a dopant for the conductive polymer, the dopant now also acts as a catalyst.

The dispersion, containing the conductive polymer and the hydroxy group-containing polymer used in the present invention, may further contain other transparent polymer, additives or cross inking agent, so long as the conductivity, transparency and smoothness of the conductive layer may be satisfied at the same time.

The transparent polymer is widely selectable from natural polymer resins or synthetic polymer resins. Water-soluble polymer or water-based polymer emulsion are particularly preferable.

The water-soluble polymer usable herein include natural polymers such as starch, gelatin and agar; semi-synthetic polymers such as cellulose derivatives including hydroxypropylmethyl cellulose, carboxymethyl cellulose, and hydroxyethyl cellulose; and synthetic polymers such as polyvinyl alcohol, polyacrylate-based polymer, polyacrylamide, polyethylene oxide, and polyvinylpyrrolidone. The water-based polymer emulsion usable herein includes acrylic resin (acryl silicone-modified resin, fluorine-modified acrylic resin, urethane-modified acrylic resin, epoxy-modified acrylic resin, etc.), polyester-based resin, urethane-based resin, and vinyl acetate-based resin.

The synthetic polymer resins usable herein include transparent thermoplastic resins (for example, polyvinyl chloride, vinyl chloride-vinyl acetate copolymer, polymethyl methacrylate, nitrocellulose, chlorinated polyethylene, chlorinated polypropylene, fluorinated vinylidene); and transparent curable resins curable by heat, light, electron beam or radiation (for example, melamine acrylate, urethane acrylate, epoxy resin, polyimide resin, and silicone resins such as acryl-modified silicate).

The additives are exemplified by plasticizer, stabilizers such as antioxidant and anti-sulfurization agent, surfactant, dissolution promoter, polymerization inhibitor, and colorants such as dye and pigment.

From the viewpoint of improving work efficiency such as coatability, the dispersion may contain a solvent (for example, water, or organic solvent such as alcohols, glycols, cellosolves, ketones, esters, ethers, amides, and carbohydrates).

As the crosslinking agent for the hydroxy group-containing polymer, for example, oxazoline-based crosslinking agent, carbodiimide-based crosslinking agent, isocyanate-based crosslinking agent, epoxy-based crosslinking agent, melamine-based crosslinking agent, and formaldehyde-based crosslinking agent are usable independently, or in combination of two or more species.

(3) Method of Forming

The polymer conductive layer in the present invention may be formed by various types of wet application process, without special limitation.

In more details, a certain application liquid is prepared using the conductive polymer (including fluorinated polymer and non-fluorinated polymer) described above, a second dopant (in particular, hydroxy group-containing polymer), solvent and so forth, and the application liquid is applied over the transparent substrate and the metal conductive layer by a wet process, followed by drying.

The wet applying process includes not only the above-mentioned gravure printing, flexographic printing and screen printing but also roll coating, bar coating, dip coating, spin coating, casting, die coating, blade coating, bar coating, gravure coating, curtain coating, spray coating, doctor coating and ink jet coating.

Among them, from the viewpoint of patterning over the metal conductive layer, gravure printing, flexographic printing and ink jet printing are preferable. Ink jet printing is particularly preferable.

<<Structure and Method for Producing of Organic EL Element (10)>>

Figure 3:
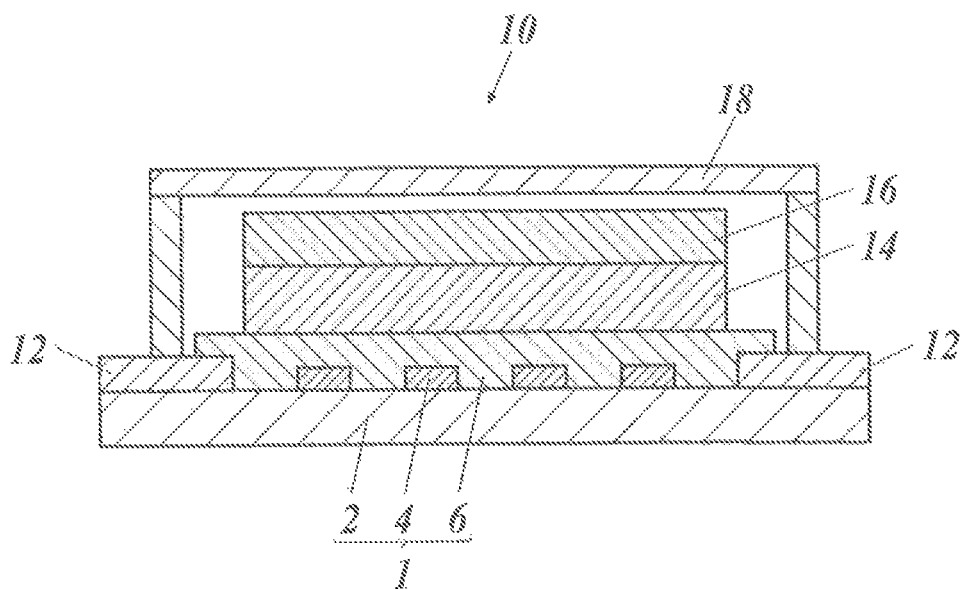
FIG. 3 is a cross sectional view illustrating a schematic structure of an organic EL element.

As illustrated in FIG. 3, an organic EL element 10 has the transparent electrode 1 composed of the transparent substrate 2, the metal conductive layer 4 and the polymer conductive layer 6.

On the side edges of the transparent substrate 2 of the transparent electrode 1, output electrodes 12 are formed. The output electrodes 12 are brought into contact with the metal conductive layer 4 and the polymer conductive layer 6, making electrical connection therewith. Over the polymer conductive layer 6 of the transparent electrode 1, an organic light emitting layer 14 is formed. The organic light emitting layer 14 is configured by a hole transport Layer, a light emitting layer, a hole blocking layer, an electron transport layer and so forth. Over the organic light emitting layer 14, a counter electrode 16 is formed. The counter electrode 16 is an electrode opposed to the transparent electrode 1 and has a polarity opposite to that of the transparent electrode 1.

In the organic EL element 1, the transparent electrode 1 and the organic light emitting layer 14 are covered and protected by a sealing component 18 which gives sealing while a part of the output electrodes 12 is left exposed.

Next, a method of manufacturing the organic EL element (10) of the present invention will be explained with referring to FIG. 4.

Figure 4A:
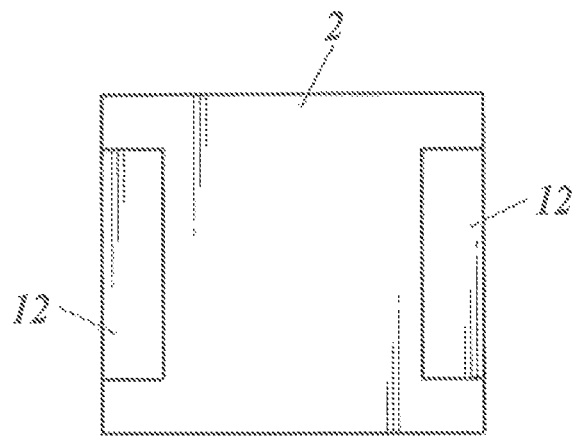
FIG. 4A is a schematic plan view for sequentially explaining a method for producing an organic EL element.

First, ITO is deposited on the transparent substrate 2 by vacuum deposition, and the deposited film is patterned by a photolithographic process into a predetermined geometry to thereby form the output electrodes 12 (FIG. 4A).

Figure 4B:
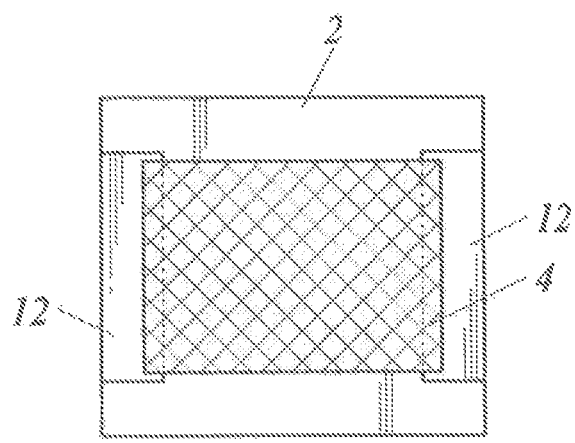
FIG. 4B is a drawing illustrating a step subsequent to FIG. 4A.

The metal conductive layer 4 is then formed by patterning, so as to partially overlap with the output electrodes 12 (FIG. 4B).

Figure 4C:
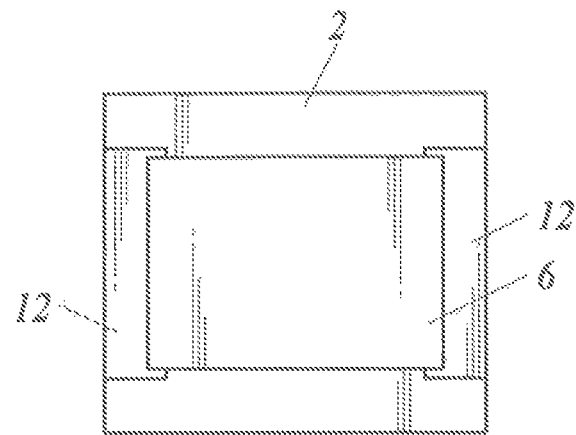
FIG. 4C is a drawing illustrating a step subsequent to FIG. 4B.

A predetermined application liquid composed of the conductive polymer, hydroxy group-containing polymer, solvent and so forth is then prepared and the application liquid is applied over the metal conductive layer 4, dried to form the polymer conductive layer 6 to thereby cover the metal conductive layer 4 with the polymer conductive layer 6 (FIG. 4C).

Figure 4D:
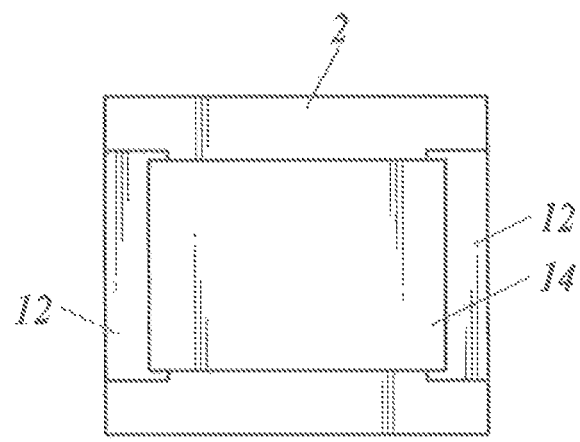
FIG. 4D is a drawing illustrating a step subsequent to FIG. 4C.

Thereafter, the organic light emitting layer 14 which is composed of the hole transport layer, light emitting layer, hole blocking layer, electron transport layer and so forth is formed over the polymer conductive layer 6 (transparent electrode 1) (FIG. 4D).

Figure 4E:
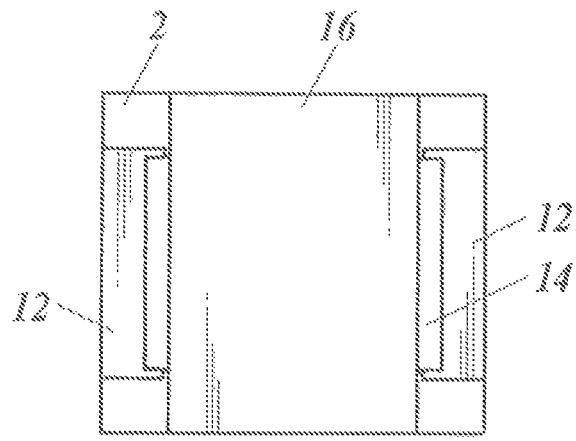
FIG. 4E is a drawing illustrating a step subsequent to FIG. 4D.
Figure 4F:
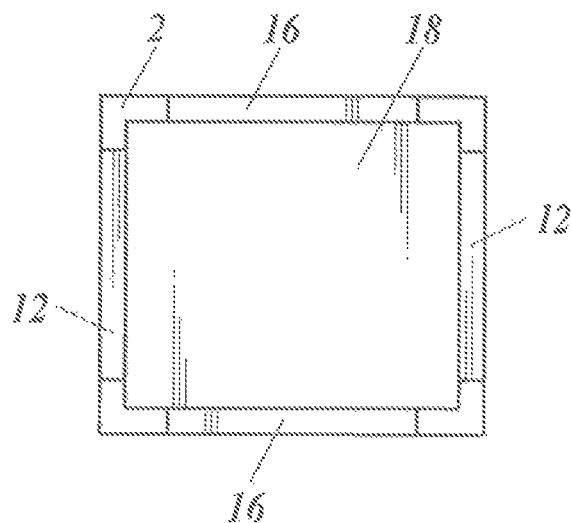
FIG. 4F is a drawing illustrating a step subsequent to FIG. 4E.

The counter electrode 16 is then formed so as to cover the organic light emitting layer 14 (FIG. 4E) and the sealing component 18 is formed so as to completely cover the transparent electrode 1 and the organic light emitting layer 14 (FIG. 4F).

The organic EL element 10 is manufactured by the processes described above.

<<Organic Electronic Element>>

The transparent electrode of the present invention is usable for various types of organic electronic elements.

The organic electronic element is configured to have an anode electrode and a cathode electrode on a support, and to have at least one organic functional layer between the electrodes. The transparent electrode is used for either one of the anode electrode and the cathode electrode, wherein the other serves as the counter electrode.

The organic functional layer is exemplified by, but not specifically limited to, organic light emitting layer, organic photoelectric conversion layer, and liquid crystal polymer layer.

The present invention is particularly effective for the case where the organic functional layer configures a thin organic light emitting layer or organic photoelectric conversion layer of current-driven elements, and is applicable to organic electronic elements such as organic EL element having the organic functional layer thereof composed of the organic light emitting layer, and organic solar cell having the organic functional layer thereof composed of an organic photoelectric conversion layer.

The present invention will specifically be explained below referring to Examples without limiting the present invention. The notation "%" in Examples stands for "% by mass" unless otherwise specifically noted.

Example 1

Manufacture of Transparent Electrode (Sample)

(1) Synthesis of Conductive Polymer

A 2.6% dispersion of poly(3,4-ethylenedioxythiophene)/Nafion (registered trademark) (abbreviated as P-1, hereinafter) was prepared according to a method described in Example 16 of JP4509787B.

(2) Synthesis of Hydroxy Group-Containing Polymer

(2.1) Initiator 1: Synthesis of Methoxy-Capped Oligoethylene Glycol Methacrylate In a 50 ml three-necked flask, 2-bromoisobutyryl bromide (7.3 g, 35 mmol), triethylamine (2.48 g, 0.35 mmol) and THF (20 ml) were put, and the internal temperature was kept at 0° C. on an ice bath into the solution, 30 ml of a 33% solution in THF of oligoethylene glycol (10 g, 23 mmol, 7 to 8 ethylene glycol, units, from Laporte Specialties) was dropped. After stirred for 30 minutes, the solution was brought up to room temperature, and further stirred for 4 hours. THF was removed under a reduced pressure using a rotary evaporator and the residue was dissolved into diethyl ether, and transferred into a separation funnel. The ether layer was washed three times with water and the ether layer was dried over $MgSO_4$. Ether was removed under a reduced pressure using a rotary evaporator to thereby obtain 8.2 g of initiator 1 (73% yield).

(2.2) Synthesis of Hydroxy Group-Containing Polymer by Living Polymerization (ATRP Process)

The initiator 1 (500 mg, 1.02 mmol), 2-hydroxyethyl acrylate (4.64 g, 40 mmol, from Tokyo Chemical Industry Co., Ltd.) and 5 ml of a 50:50 v/v % methanol/water mixed solvent were put into a Schlenk flask, and the Schlenk flask was dipped into liquid nitrogen for 10 minutes under a reduced pressure. The Schlenk flask was taken out from liquid nitrogen, and replaced by nitrogen 5 minutes after. The operation was repeated three times, then bipyridine (400 mg, 2.56 mmol) and CuBr (147 mg, 1.02 mmol) were added under a nitrogen atmosphere, and the content was stirred at 20° C. Thirty minutes after, the reaction solution was dropped on a 4-cm Kiriyama funnel with a filter paper and silica placed thereon, and the filtrate was collected under a reduced pressure. The solvent was removed under a reduced pressure using a rotary evaporator and the residue was dried at 50° C. for 3 hours. As a consequence, 2.60 g (84% yield) of poly(2-hydroxyethyl acrylate) with a number-average molecular weight of 13,100, a molecular weight distribution of 1.17 and containing 0% content of number-average molecular weight of smaller than 1,000 was obtained as the hydroxy group-containing polymer. The structure and molecular weight were measured respectively by $^3$H-NMR (430 MHz, from JEOL Ltd.) and GPC (Waters 2695, from Waters Corporation). The obtained polymer was diluted with water to prepare a 20% solution (abbreviated as P-3, hereinafter).

(GPC Measurement Conditions)
Apparatus: Wagers 2695 (separations module)
Detector: Waters 241.4 (refractive index detector)
Column: Shodex Asahipak GF-7M HQ
Eluent: dimethylformamide (20 mM LiBr)
Flow rate: 1.0 ml/min
Temperature: 40° C.

(3) Formation of Output Electrode

Output electrode was formed according to the method described below.

An ITO film with an average thickness of 150 nm was deposited on a glass substrate, patterned by a photolithographic process as illustrated in FIG. 4A. The substrate was dipped in 2-propanol, and washed under ultrasonic wave using a ultrasonic cleaner Bransonic 3510J-MT (from Emerson Japan Ltd.) for 10 minutes.

(4) Formation of Transparent Electrode

On the ITO-surface of the thus obtained transparent glass substrate used for the transparent electrode, a metal conductive layer and a polymer conductive layer were stacked to manufacture the transparent electrode.

(4.1) Formation of Metal Conductive Layer

The metal conductive layer was formed according to the method described below.

On the above-mentioned glass substrate, a silver nano-ink (TEC-PA-010: from InkTec Corporation) was applied to form a mesh pattern of 50 μm wide and 1 mm pitch by screen printing to thereby form the metal conductive layer configured by a metal thin line pattern. The metal conductive layer was further dried at 110° C. for 5 minutes, and fired at 250° C. for 5 minutes.

The screen printing herein was conducted using a screen printing machine STF-150IP (from Tokai Shoji Co., Ltd.).

From measurement using a high-luminance, non-contact, three-dimensional roughness gauge WYKO NT9100 (from Veeco Instruments, Inc.), the patterned metal conductive layer was found to be 60 μm wide and 500 nm high in average.

(4.2) Formation of Polymer Conductive Layer

Over the patterned metal conductive layer, each of application liquids 101 to 108 for forming the polymer conductive layer listed in Table 1, which are composed of conductive polymer(s) (P-1, P-2), hydroxy group-containing polymer (P-3) and solvent (s) (S-1 to S-3), was applied in the area illustrated in FIG. 4C using an ink jet printer, so as to attain an average dry thickness of 500 nm.

(Application Liquids Listed in Table 1)
P-1: poly(3,4-ethylenedioxythiophene)/Nafion (registered trademark) (fluorinated polymer acid), 2.6% solution;
P-2: Clevios PH750 (from Heraeus) (non-fluorinated polymer acid), 1.08% solution;
P-3: poly(2-hydroxyethyl acrylate) (PHEA), 20% aqueous solution;
S-1: 2-propanol (IPA);
S-2: propylene glycol (PG);
S-3: propylene glycol monopropyl ether (PGPr).

TABLE 1

| APPLICATION LIQUID SAMPLE | SOLID CONTENT CONCENTRATION (wt %) | CONDUCTIVE POLYMER P-1 (F-CONTAINING) | P-2 (F-FREE) | OH-CONTAINING POLYMER P-3 (PHEA) | SOLVENT S-1 (IPA) | S-2 (PG) | S-3 (PGPr) | REMARK | COMPOSITIONAL RATIO (BY WEIGHT) P-1 (F-CONTAINING) | P-2 (F-FREE) | P-3 (PHEA) |
|---|---|---|---|---|---|---|---|---|---|---|---|
| 101 | 1.0 | 0.0 | 46.3 | 0.0 | 3.7 | 0.0 | 0.0 | COMPARATIVE EXAMPLE | 0 | 100 | 0 |
| 102 | 2.5 | 48.1 | 0.0 | 0.0 | 1.9 | 0.0 | 0.0 | EXAMPLE | 100 | 0 | 0 |
| 103 | 2.5 | 4.8 | 34.7 | 3.8 | 1.7 | 2.5 | 2.5 | PRESENT INVENTION | 10 | 30 | 60 |
| 104 | 2.5 | 7.2 | 28.9 | 3.8 | 3.6 | 4.0 | 2.5 | | 15 | 25 | 60 |
| 105 | 2.5 | 7.2 | 23.1 | 4.1 | 8.1 | 5.0 | 2.5 | | 15 | 20 | 65 |
| 106 | 2.5 | 4.8 | 23.1 | 4.4 | 10.2 | 5.0 | 2.5 | | 10 | 20 | 70 |
| 107 | 2.5 | 4.8 | 17.4 | 4.7 | 13.1 | 5.0 | 5.0 | | 10 | 15 | 75 |
| 108 | 2.5 | 2.4 | 17.4 | 5.0 | 12.7 | 5.0 | 7.5 | COMPARATIVE EXAMPLE | 5 | 15 | 80 |

The coating was then dried at 80° C. for 5 minutes and further heated at 240° C. for 10 minutes to thereby manufacture "transparent electrodes 201 to 208" composed of the metal conductive layer and the polymer conductive layer as listed in Table 2 and Table 3.

Besides the transparent electrodes 201 to 208, the application liquid 101 was applied over the patterned metal conductive layer by the same method so as to attain a dry thickness of 400 nm and further thereon the application liquid 102 was applied so as to attain a dry thickness of 100 nm to thereby manufacture a "transparent electrode 209".

The ink jet printer used herein was a desktop-type robot Shotmaster-300 (from Musashi Engineering, Inc.) attached with an ink jet head (from Konica Minolta IJ Technologies, Inc.), controlled by an ink jet evaluation device EB150 (from Konica Minolta IJ Technologies, Inc.).

<<Evaluation of Transparent Electrode (Sample)>>

The concentration distribution of the fluorinated polymer acid in the polymer conductive layer of the individual transparent electrodes was measured according to the method described below and the individual transparent electrodes were then evaluated with respect to work function, surface specific resistance and transmittance.

trometer Quantera SXM (from Ulvac-Phi, Inc.) equipped with an ion gun IOG C60-10 (from Ionoptika Ltd.). A 5% thick portion of the polymer conductive layer was removed from the surface using the ion gun, and XPS was measured for every 10% depth up to a 95% depth from the surface.

The amount of polystyrenesulfonic acid used as non-fluorinated polymer acid was determined from a peak assignable to sulfonic acid (S), the amount of fluorinated polymer acid was determined from a peak assignable to fluorine (—$CF_2$—), ratio of amount of the fluorinated polymer acid relative to the total amount of both polymer acids was determined, and each concentration value relative to an integrated concentration value obtained from 10 points along the depth was determined as a depth-wise relative concentration of the fluorinated polymer acid.

Table 2 shows the relative concentration distribution values of the fluorinated polymer acid for the individual relative depths in the direction from the surface of the polymer conductive layer towards the transparent substrate, and relative integrated values of the fluorinated polymer acid obtained over a range from the surface of the polymer conductive layer to a 30% relative depth.

TABLE 2

| TRANSPARENT ELECTRODE SAMPLE | SURFACE SIDE ← DEPTH IN POLYMER CONDUCTIVE LAYER (%) → SUBSTRATE SIDE | | | | | | | | | | INTEGRATED AMOUNT OVER 0-30% RANGE | REMARK |
|---|---|---|---|---|---|---|---|---|---|---|---|---|
| | 5 | 15 | 25 | 35 | 45 | 55 | 65 | 75 | 85 | 95 | | |
| 201 | — | — | — | — | — | — | — | — | — | — | — | COMPARATIVE EXAMPLE |
| 202 | — | — | — | — | — | — | — | — | — | — | — | |
| 203 | 24 | 22 | 19 | 12 | 6 | 4 | 4 | 3 | 3 | 3 | 65 | PRESENT INVENTION |
| 204 | 23 | 21 | 19 | 10 | 6 | 6 | 5 | 5 | 4 | 3 | 63 | |
| 205 | 20 | 19 | 18 | 13 | 6 | 6 | 5 | 5 | 4 | 4 | 58 | |
| 206 | 23 | 21 | 15 | 10 | 8 | 7 | 6 | 5 | 3 | 2 | 59 | |
| 207 | 21 | 20 | 17 | 13 | 8 | 7 | 4 | 4 | 4 | 4 | 58 | |
| 208 | 22 | 21 | 16 | 12 | 10 | 5 | 5 | 3 | 3 | 3 | 59 | |
| 209 | — | — | — | — | — | — | — | — | — | — | — | COMPARATIVE EXAMPLE |

(1) Concentration Distribution of Fluorinated Polymer Acid

The depth-wise concentration distribution of the fluorinated polymer acid was evaluated based on XPS depth profile measurement using an X-ray photoelectron spec- As shown in Table 2, the transparent electrodes 203 to 208 of the present invention were found to show the concentration of the fluorinated polymer acid gradually increasing from the transparent substrate side towards the surface of the conductive polymer layer, and particularly found that 50% or more of the fluorinated polymer acid was localized within a 30% range of the relative thickness from the surface of the conductive polymer layer.

(2) Work Function

Work function of the surface of the polymer conductive layer was calculated using an X-ray photoelectron spectrometer ESCA Lab200R (from Vacuum Generators, Inc.). Results of calculation are shown in Table 3.

(3) Surface Specific Resistance

Surface specific resistance of the transparent electrode was measured at five spots by the four-electrode method using a resistivity meter Rolesta GP (from Dia Instruments Co., Ltd.), and the average values were evaluated according to the criteria below. Results of evaluation are shown in Table 3.
"⊚ (double circle)": <5,000 [Ω/□]
"○ (circle)": 5,000≤, <10,000 [Ω/□]
"Δ (triangle)": 10,000≤, <50,000 [Ω/□]
"x": 50,000≤, <100,000 [Ω/□]
"xx": 100,000≤[Ω/□]

(4) Transmittance

Total light transmittance of the transparent electrodes was measured using an automatic haze meter (Model TC-HII-IDP, from Tokyo Denshoku Co., Ltd.), and evaluated according to the criteria below. Results are shown in Table 3.
"⊚ (double circle)": 80%≤, ≤100%
"○ (circle)": 75%≤, <80%
"Δ (triangle)": 70%≤, <75%
"x": 50%≤, <70%
"xx": 0%≤, <50%

TABLE 3

| TRANSPARENT ELECTRODE SAMPLE | WORK FUNCTON (eV) | SURFACE SPECIFIC RESISTANCE | TRANSMITTANCE | REMARK |
| --- | --- | --- | --- | --- |
| 201 | 5.1 | ⊚ | X | COMPARATIVE EXAMPLE |
| 202 | 5.7 | X | X | |
| 203 | 5.7 | ⊚ | ⊚ | PRESENT INVENTION |
| 204 | 5.7 | ⊚ | ⊚ | |
| 205 | 5.6 | ⊚ | ⊚ | |
| 206 | 5.6 | ⊚ | ⊚ | |
| 207 | 5.6 | ⊚ | ⊚ | |
| 208 | 5.6 | ⊚ | ⊚ | |
| 209 | 5.7 | Δ | X | COMPARATIVE EXAMPLE |

(5) Conclusion

As shown in Table 3, the transparent electrodes 203 to 208 of the present invention were found to have low surface specific resistance and large transmissivity of light, proven to be well balanced between conductivity and transparency. The transparent electrode 209 was found to have a surface specific resistance of 20,000 Ω/□.

Example 2

Manufacture of Organic EL Element (Sample)

Using the transparent electrodes 201 to 209 manufactured in Example 1, organic EL elements 301 to 309 were respectively manufactured according to the method described below.

(1) Formation of Organic Light Emitting Layer

On the polymer conductive layer of the transparent electrode, an organic light emitting layer (hole transport layer, light emitting layer, hole blocking layer, electron transport layer) was formed as described below.

The layers subsequent to the hole transport layer were formed by vacuum evaporation. Predetermined amounts of ingredients, optimized for manufacturing the element were filled in the individual evaporation crucibles of a commercially-available vacuum evaporation apparatus. The evaporation crucibles used herein were those made of materials suitable for resistance heating, such as molybdenum or tungsten.

(1.1) Formation of Hole Transport Layer

After the apparatus was evacuated to a degree of vacuum of $1 \times 10^{-4}$ Pa, the crucible filled with Compound 1 was heated by supplying current, Compound 1 was deposited onto an area of the transparent electrode illustrated in FIG. 4D at a rate of deposition of 0.1 nm/sec, to thereby form a hole transport layer of 30 nm thick.

(1.2) Formation of Light Emitting Layer

Next, the light emitting layer was provided according to the procedures described below.

Over the thus formed hole transport layer, Compound 2, Compound 3 and Compound 5 were co-deposited in the area illustrated in FIG. 4D at a rate of deposition of 0.1 nm/sec, so as to adjust the concentration of Compound 2 to 13% by mass, Compound 3 to 3.7% by mass and Compound 5 to 83.3% by mass. A green-to-red phosphorescence light emitting layer of 10 nm thick showing an absorption maximum at 622 nm was thus formed.

Next, Compound 4 and Compound 5 were co-deposited in the area illustrated in FIG. 4D at a rate of deposition of 0.1 nm/sec, so as to adjust the concentration of Compound 4 to 10.0% by mass and Compound 5 to 90.0% by mass. A blue phosphorescence light emitting layer of 15 nm thick, showing an absorption maximum at 471 nm, was thus formed.

(1.3) Formation of Hole Blocking Layer

Over the thus formed light emitting layers and in the area illustrated in FIG. 4D, Compound 6 was deposited to form a hole blocking layer of 5 nm thick.

(1.4) Formation of Electron Transport Layer

Next, over the thus formed hole blocking layer and in the area illustrated in FIG. 4D, CsF was co-deposited with Compound 6 so as to adjust the ratio of thickness to 10% to thereby form an electron transport layer of 45 nm thick.

[Chemical Formula 7]

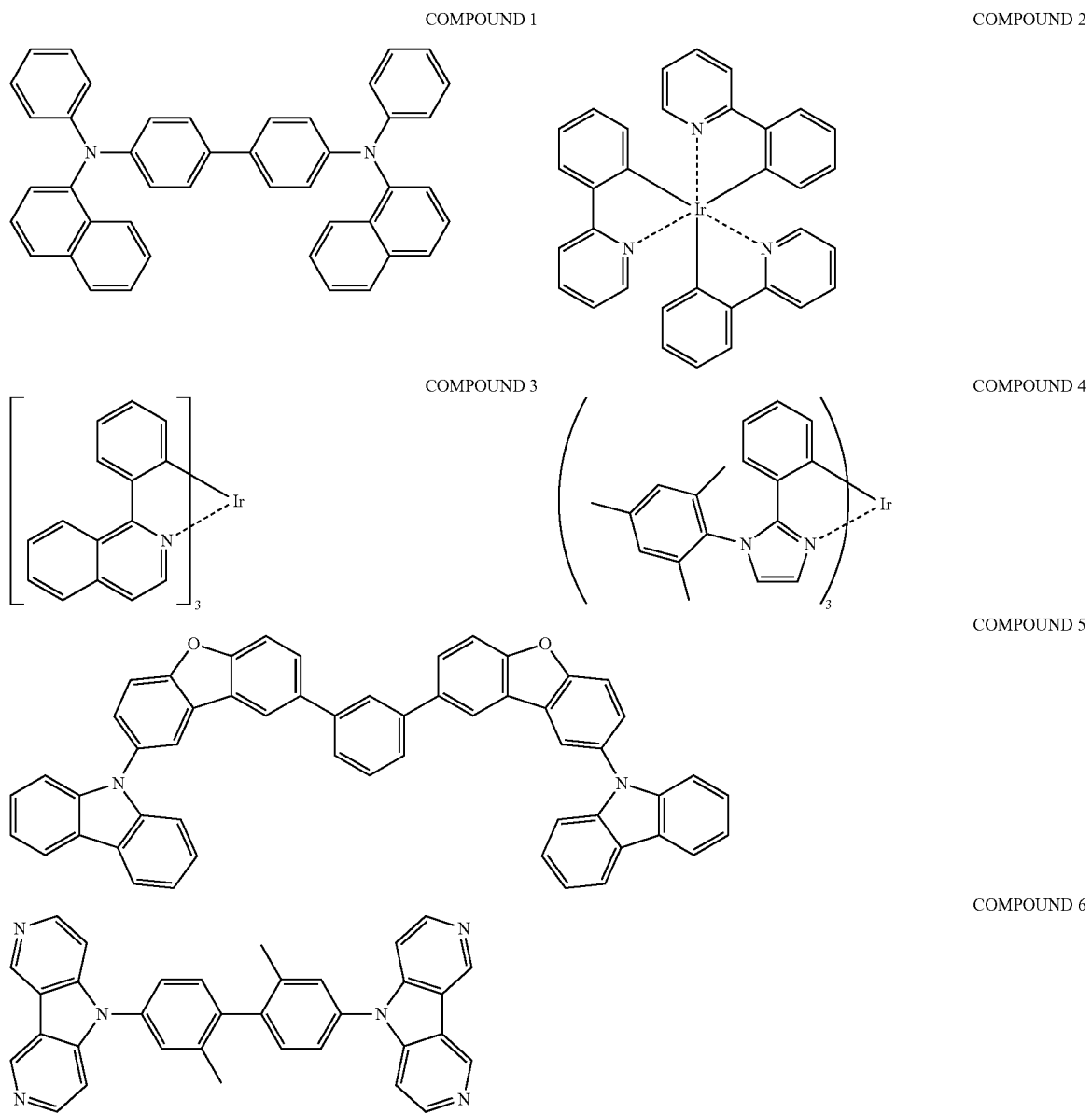

(2) Formation of Second Electrode

Over the thus formed electron transport layer, Al was deposited in the area illustrated in FIG. 4E under a degree of vacuum of $5\times10^{-4}$ Pa to thereby form a cathode electrode of 100 nm thick.

(3) Formation of Sealing Film

Over the thus formed cathode electrode, a flexible sealing component, composed of a polyethylene terephthalate substrate having an $Al_2O_3$ film of 300 nm thick deposited thereon by evaporation, was placed. Using an adhesive, the flexible sealing component was bonded to an area illustrated in FIG. 4F, and the adhesive was allowed to cure by heat treatment. Portions of the output electrode and the Al film exposed out from the sealing component were respectively assumed as extraction terminals of a first electrode (anode) and a second electrode (cathode). "Organic EL elements 301 to 309" were thus manufactured.

<<Evaluation of Organic EL Element (Sample)>>

The thus obtained individual organic EL elements were allowed to emit light at 1000 cd/m² under DC current supply using a source measure unit model 2400 (from Keithley Instruments, Inc.). Five each of the individual organic EL elements were manufactured and evaluated.

(1) Non-Uniformity in Emission

The individual organic EL elements were allowed to emit light at a luminance of 1000 cd/m² under applied DC voltage, and non-uniformity was evaluated by visually observing the state of emission.

"⊚ (double circle)": completely uniform emission, excellent;

"○ (circle)": almost uniform emission, satisfactory;
"Δ (triangle)": partially slightly non-uniform emission, but acceptable;
"x": entirely non-uniform emission, unacceptable;
"xx": no emission.

(2) Emission Service Life

The thus obtained organic EL elements were allowed to continuously emit light at an initial luminance of 5000 cd/m², the voltage was fixed, and time spent before the luminance reduced by half was determined. An organic EL element having the anode composed of ITO was manufactured in the same way as described above, ratio of luminance relative thereto was determined, and evaluated according to the criteria below:
"⊚ (double circle)": 150%≤
"○ (circle)": 100%≤, <150%
"Δ (triangle)": 80%≤, <100%
"x": <80%
"xx": No emission, or organic EL element not manufacturable due to deformation of films.

(3) Rectification Ratio

The individual organic EL elements were applied with a voltage of +3V/−3V, current values were measured, rectification ratios were determined using the equation below, and evaluated according to the criteria below. The rectification ratio decreases if leakage occurs between the electrodes. A practical range of the ratio is $10^2$ or larger.

Rectification ratio=(Current value under+3 V)/(Current value under−3 V)

"⊚ (double circle)": 1000≤
"○ (circle)": 100≤, <1000
"Δ (triangle)": 50≤, <100
"x": 10≤, <50
"xx": 1≤, <10

TABLE 4

| ORGANIC EL ELEMENT SAMPLE | NON-UNI- FORMITY IN EMISSION | EMISSION SERVICE LIFE | RECTIFI- CATION RATIO | REMARK |
|---|---|---|---|---|
| 301 | Δ | X | ○ | COMPAR- ATIVE EXAMPLE |
| 302 | ○ | X | ○ | |
| 303 | ⊚ | ⊚ | ⊚ | PRESENT INVENTION |
| 304 | ⊚ | ⊚ | ⊚ | |
| 305 | ⊚ | ○ | ○ | |
| 306 | ⊚ | ○ | ⊚ | |
| 307 | ⊚ | ○ | ○ | |
| 308 | ⊚ | ○ | ○ | |
| 309 | ○ | X | ○ | COMPAR- ATIVE EXAMPLE |

(4) Conclusion

As shown in Table 4, the organic EL elements 303 to 308 using the transparent electrodes 203 to 208 of the present invention were found to give excellent results in terms of non-uniformity in emission, emission service life and rectification ratio, proving that use of the transparent electrodes 203 to 208 in the organic EL element improves the performances of the organic EL element.

In particular, the organic EL elements 303, 304 using the transparent electrodes 203, 204, which have a fluorinated polymer acid distribution such that 60% or more of the entire fluorinated polymer acid localizes within a 30% range of the relative thickness from the surface of the polymer conductive layer, were found to give good effects.

INDUSTRIAL APPLICABILITY

The present invention is advantageous to provide a transparent electrode which concurrently satisfies transparency and conductivity, and in particular, to improve the performances of an organic electronic element when incorporated with the transparent electrode.

EXPLANATION OF SYMBOLS 1 transparent electrode
2 transparent substrate
4 metal conductive layer
6 polymer conductive layer
10 organic EL element
12 output electrode
14 organic light emitting layer
16 counter electrode
18 sealing component

What is claimed is:

1. A transparent electrode comprising:

a transparent substrate;

a metal conductive layer composed of a metal thin line pattern; and a polymer conductive layer comprising a conductive polymer containing a polymer acid, wherein the metal conductive layer being formed on/over the transparent substrate and the metal conductive layer being covered with the polymer conductive layer, and wherein the polymer conductive layer has a surface specific resistance of 10,000Ω/□ or smaller, the polymer acid contains a fluorinated polymer acid and a non-fluorinated polymer acid, and in the polymer conductive layer, a concentration of the fluorinated polymer acid increases along a direction from the transparent substrate towards the polymer conductive layer.

2. The transparent electrode of claim 1, wherein 50% or more of the total fluorinated polymer acid is localized within a portion that is 30% of a relative film thickness from a front surface side of the polymer conductive layer.

3. The transparent electrode of claim 2, wherein the polymer conductive layer contains one hydroxy group-containing polymer selected from the group consisting of a polymer (A) composed of a structural unit (I) containing a hydroxy group; and a polymer (B) composed of the structural unit (I), and a structural unit (II) having no hydroxy group but having an ester or amide bond;

wherein the structural unit(I) comprises (Chemical Formula 1)

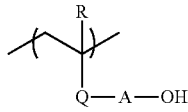
(I)

in which R represents a hydrogen atom or methyl group, and Q represents —C(=O)O— or —C(=O)NRa—, Ra represents a hydrogen atom or alkyl group, A represents a substituted or unsubstituted alkylene group, or —(CH$_2$CHRbO)x—CH$_2$CHRb-, Rb represents a hydrogen atom or alkyl group, and x represents the average number of repeating unit given by an integer from 0 to 100; and
wherein the structural unit(II) comprises (Chemical Formula 2)

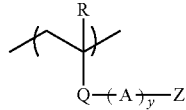
(II)

in which R represents a hydrogen atom or methyl group, Q represents —C(=O)O— or —C(=O)NRa—, Ra represents a hydrogen atom or alkyl group, A represents a substituted or unsubstituted alkylene group, or —(CH$_2$CHRbO)$_x$—CH$_2$CHRb-, Rb represents a hydrogen atom or alkyl group, x represents the average number of repeating unit given by an integer from 0 to 100, y represents 0 or 1, Z represents an alkoxy group, —O—C(=O)—Rc, —O—SO$_2$—Rd or —O—SiRe$_3$, and each of Rc, Rd and Re represents an alkyl group, perfluoroalkyl group or aryl group.

4. The transparent electrode of claim 1,
wherein the polymer conductive layer contains one hydroxy group-containing polymer selected from the group consisting of
a polymer (A) composed of a structural unit (I) containing a hydroxy group; and
a polymer (B) composed of the structural unit (I), and a structural unit (II) having no hydroxy group but having an ester or amide bond;
wherein the structural unit(I) comprises (Chemical Formula 1)

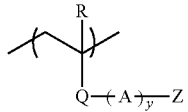
(I)

in which R represents a hydrogen atom or methyl group, and Q represents —C(=O)O— or —C(=O)NRa—, Ra represents a hydrogen atom or alkyl group, A represents a substituted or unsubstituted alkylene group, or —(CH$_2$CHRbO)$_x$—CH$_2$CHRb—, Rb represents a hydrogen atom or alkyl group, and x represents the average number of repeating unit given by an integer from 0 to 100; and
wherein the structural unit(II) comprises (Chemical Formula 2)

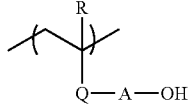
(II)

in which R represents a hydrogen atom or methyl group, Q represents —C(=O)O— or —C(=O)NRa—, Ra represents a hydrogen atom or alkyl group, A represents a substituted or unsubstituted alkylene group, or —(CH$_2$CHRbO)$_x$—CH$_2$CHRb-, Rb represents a hydrogen atom or alkyl group, x represents the average number of repeating unit given by an integer from 0 to 100, y represents 0 or 1, Z represents an alkoxy group, —O—C(=O)—Rc, —O—SO$_2$-Rd or —O—SiRe$_3$, and each of Rc, Rd and Re represents an alkyl group, perfluoroalkyl group or aryl group.

5. The transparent electrode of claim 1,
wherein the metal thin line pattern of the metal conductive layer comprises stripes or a mesh.

6. The transparent electrode of claim 5,
wherein the metal conductive layer has an aperture ratio of 80% or larger.

7. The transparent electrode of claim 6,
wherein a height of the metal thin line pattern of the metal conductive layer is 0.2 to 2.0 μm.

8. The transparent electrode of claim 6,
wherein the polymer conductive layer has a surface specific resistance of smaller than 5,000 Ω/□.

9. The transparent electrode of claim 8,
wherein the metal thin line pattern of the metal conductive layer comprises stripes or a mesh.

10. The transparent electrode of claim 1,
wherein the concentration of the fluorinated polymer acid does not decrease, even temporarily, on an exposed surface side of the polymer conductive layer in a thickness-wise direction of the polymer conductive layer compared with the transparent substrate side.

11. The transparent electrode of claim 6,
wherein a dry thickness of the polymer conductive layer is 30 to 2,000 nm.

12. The transparent electrode of claim 6,
wherein a dry thickness of the polymer conductive layer is 100 to 1,000 nm.

* * * * *